United States Patent
Iida et al.

(10) Patent No.: US 6,280,910 B1
(45) Date of Patent: Aug. 28, 2001

(54) PHOTORESIST FOR OPTICAL DISC AND METHOD OF PREPARING OPTICAL DISC UTILIZING PHOTORESIST

(75) Inventors: Tetsuya Iida; Takanobu Higuchi; Hironao Sasaki; Kunizo Ogoshi, all of Tsurugashima (JP)

(73) Assignee: Pioneer Electronic Corporation, Tokyo (JP)

( * ) Notice: Subject to any disclaimer, the term of this patent is extended or adjusted under 35 U.S.C. 154(b) by 0 days.

(21) Appl. No.: 09/547,135

(22) Filed: Apr. 11, 2000

Related U.S. Application Data

(62) Division of application No. 07/980,280, filed on Nov. 23, 1992.

(51) Int. Cl.⁷ ................................................. G03C 5/16
(52) U.S. Cl. ............................ 430/321; 430/320; 430/326
(58) Field of Search ..................................... 430/321, 325, 430/320

(56) References Cited

U.S. PATENT DOCUMENTS

| | | | |
|---|---|---|---|
| 4,732,844 | * 3/1988 | Ota et al. ............................. | 430/322 |
| 4,837,130 | * 6/1989 | Ohta et al. ........................... | 430/321 |
| 4,882,260 | 11/1989 | Kohara et al. ....................... | 430/192 |
| 4,971,887 | 11/1990 | Schmitt et al. ...................... | 430/192 |
| 4,985,333 | 1/1991 | Tokutake et al. .................... | 430/192 |
| 4,988,601 | 1/1991 | Ushirogouchi et al. ............. | 430/192 |
| 5,087,548 | 2/1992 | Hosaka et al. ....................... | 430/192 |
| 5,110,706 | 5/1992 | Yumoto et al. ...................... | 430/192 |
| 5,124,228 | 6/1992 | Uetani et al. ........................ | 430/192 |
| 5,183,722 | 2/1993 | Tsutsumi et al. .................... | 430/193 |
| 6,025,118 | * 2/2000 | Morton ................................ | 430/320 |

FOREIGN PATENT DOCUMENTS

| | | |
|---|---|---|
| 2545957 | 4/1977 | (DE) . |
| 4140712 | 10/1992 | (DE) . |
| 0390173 | 10/1990 | (EP) . |

OTHER PUBLICATIONS

Database WPIL, Section Ch., Week 9045, Nov. 1990.
Datbase WPI1, Section Ch., Week 9038, Sep. 1990.

\* cited by examiner

*Primary Examiner*—John S. Chu
(74) *Attorney, Agent, or Firm*—Sughrue, Mion, Zinn, Macpeak & Seas, PLLC

(57) ABSTRACT

An optical disc is prepared by the steps of coating a positive photoresist comprising a photosensitive material and a base resin, satisfying a value of A in a formula $A=(a_1-a_3)\,m_{10}$ and a value of B in a formula $B=(a_2 m_{20}+a_3 m_{10})$, being constant, is in a range of B value <0.3 on a glass substrate to form a resist film, forming a pit pattern through a light exposure to the resist film, developing the resist film after the light exposure to form a resist original, effecting a plating treatment to the resist original to form a stamper through an electrocasting treatment, forming a replica disc through an injection molding process by utilizing the stamper, forming a reflection film on the replica disc, and forming an overcoat layer on the reflection film.

5 Claims, 1 Drawing Sheet

PHOTORESIST FOR OPTICAL DISC AND METHOD OF PREPARING OPTICAL DISC UTILIZING PHOTORESIST

This Application is a Division of Ser. No. 07/980,280 filed Nov. 23, 1992.

BACKGROUND OF THE INVENTION

This invention relates to a photoresist for an optical disc particularly capable of being preferably utilized for manufacturing an optical disc having high recording density and also relates to a method of preparing an optical disc by utilizing the photoresist.

In a conventional art, an optical disc is generally manufactured in accordance with the following steps.

First, a positive-type photoresist is coated with uniform thickness on a glass substrate which was ground finely to thereby form a photoresist layer. In the next step, a laser beam is irradiated to a portion of the photoresist layer at which a pit is formed. A portion of the photoresist layer irradiated to the laser beam is easily dissolved in an alkali liquid developer in comparison with another portion not irradiated. Accordingly, when the development is performed by coating the alkali liquid developer on the photoresist layer, a recess corresponding to a pit is formed to the portion irradiated to the laser beam. Thereafter, a metallic film is formed on the photoresist layer to which an electro conductivity is imparted, and in this step, for example, silver (Ag) or nickel (Ni) may be utilized as a metal for forming the metallic film. In the next step, an electrocasting treatment is performed to form an electrocast product, Ni electrocast, for example, on the metallic film. The nickel electrocast is then peeled off from the glass substrate and the photoresist layer together with the metallic film, the thus peeled off nickel electrocast and metallic film being called a metallic original, i.e. stamper.

In such optical disc original manufacturing steps, a photoresist for manufacturing a semiconductor is utilized as it is in the conventional art.

However, in recent studies and experiments of the inventors of the subject application for achieving high density of an optical disc, it was found that the conventional photoresist for manufacturing a semiconductor is not suitable for the manufacturing of the optical disc having high recording density.

Namely, in a case where an optical disc original having high density with small pit size is manufactured by utilizing a conventional photoresist for manufacturing a semiconductor and the optical disc is formed from this optical disc original, a noise level increases at a reproduction time in accordance with the reduction of the pit size and, hence, a sufficient CN ratio (carrier-wave/noise ratio), this providing a significant problem.

SUMMARY OF THE INVENTION

An object of this invention is to substantially eliminate the defects or drawbacks encountered in the prior art described above and to provide a photoresist for an optical disc and a method of preparing an optical disc utilizing the photoresist, capable of obtaining an optical disc having improved high recording density in which pit shapes are not uneven in making small the pit size, and hence, with the low noise level at a reproduction time and the improved CN ratio.

This and other objects can be achieved according to this invention by providing a positive-type photoresist adapted for manufacture of an optical disc original comprising a photosensitive material and a base resin, in which a value A in a formula $A=(a_1-a_3)m_{10}$, wherein $a_1$ represents a molar absorption coefficient of the photosensitive material with respect to a light utilized for an actual recording, $a_3$ represents a molar absorption coefficient of a decomposed product derived from the photosensitive material with respect to a light utilized for an actual recording and $m_{10}$ represents an original density of the photosensitive material, is in a range of $1.2 \leq A$ value $\leq 2.0$, and in which a value of B in a formula $B=(a_2m_{20}+a_3m_{10})$, wherein $a_2$ represents a molar absorption coefficient of the base resin with respect to a light utilized for an actual recording, $a_3$ represents a molar absorption coefficient of a decomposed product with respect to a light utilized for an actual recording, $m_{10}$ represents an original density of the photosensitive material and $m_{20}$ represents a density of the base resin, being constant, is in a range of B value $\leq 0.3$.

According to this invention, there is also provided a method of preparing an optical disc comprising the steps of:

Preparing a positive-type photoresist composed of a base resin and a photosensitive material and also preparing a glass substrate;

coating the photoresist on the glass substrate to form a resist film;

forming a pit pattern through a light exposure to the resist film;

developing the resist film after the light exposure to form a resist original;

effecting a plating treatment to the resist original to form a stamper;

forming a replica disc through an injection molding process by utilizing the stamper;

forming a reflection film on the replica disc; and forming an overcoat layer on the reflection film, wherein the positive-type photoresist satisfies a condition that a value of A in a formula $A=(a_1-a_3)\,m_{10}$, wherein $a_1$ represents a molar absorption coefficient of the photosensitive material with respect to a light utilized for an actual recording, $a_3$ represents a molar absorption coefficient of a decomposed product derived from the photosensitive material with respect to light utilized for actual recording. and $m_{10}$ represents an original density of the photosensitive material, is in a range of $1.2 \leq A$ value $\leq 2.0$, and in which a value of B in a formula $B=(a_2\,m_{20}+a_3m_{10})$, wherein $a_2$ represents a molar absorption coefficient of the base resin with respect to a light utilized for an actual recording, $a_3$ represents a molor absorption coefficient of a decomposed product with respect to a light utilized for an actual recording, $m_{10}$ represents an original density of the photosensitive material and $m_{20}$ represents a density of the base resin, being constant, is in a range of B value $\leq 0.3$.

The stamper may be formed by an electrocasting method.

According to the photoresist of the character described above, a resolving power of the exposure development, i.e. gradiation displaying ability, can be improved without damaging the resolution. Accordingly, when an optical disc with high density having small pit size is manufactured by utilizing this photoresist, the product optical disc has less shape unevenness even in the small pit size, whereby the noise level can be lowered during the reproduction and the improved CN ratio can be achieved.

The component of the photoresist of the optical disc of the character described above will be mentioned hereunder.

The photoresist includes a base resin and a photosensitive agent. An alkali fusible novolak resin is preferably utilized as the base resin, for example, and it is desired for this base resin to have a small molecular weight distribution (weight average molecular weight $M_w$/number average molecular weight $M_n$), and preferably, the molecular weight distribution $M_w/M_n$ is a value less than 5.8. On the other hand, o-quinonediazido or naphtho-quinonediazido may be utilized as the photosensitive agent utilized together with the base resin.

This photoresist for the optical disc is a light fusible (positive type) photosensitive resin which becomes alkali fusible by the irradiation of light, which satisfy the condition that the value A in the formula (1) is within a range of $1.2 \leq A$ value $\leq 2.0$ and the value B in the formula (2) is within a range of B value $\leq 0.3$.

The A value denotes a rate of change of transmittance per unit depth of a resist film and the B value denotes an optical density of the base resin and the decomposed material per unit depth of the resist film. With reference to the photoresist in which these A and B values are within the ranges described above, a resolving power of the exposure development, i.e. gradation displaying ability, can be improved without damaging the resolution. Accordingly, when an optical disc with high density having small pit size is manufactured by utilizing such photo-resist, the product optical disc has less shape unevenness in the pit shape, whereby the noise level can be lowered during the reproduction and the improved CN ratio can be achieved.

Further, the first density $m_{10}$ of the photo-sensitive agent in the formula (1) is represented by a value, that is, $m_1$ (x, 0)=$m_{10}$ in the case of t=0, where $m_1$ (x, t) is molar concentration of the photosensitive agent determined by the depth x in the resist and the exposure time t.

It is difficult to specifically determine the content ratio of the base resin and the photosensitive agent for satisfying the equations of the A and B values, i.e. $1.2 \leq A$ value $\leq 2.0$ and B value $\leq 0.3$, shown in the formula (1) and (2) for the reason that the content ratio is different in combination of and the kinds of the base resin and the photosensitive agent. However, for example, in the photoresist in combination of the alkali fusible novolak resin and the naphthoquinonediazido, it is desired to contain more than 30 weight parts, preferably 36 to 48 weight parts of the naphthoquinonediazido with respect to 100 weight parts of the alkali fusible novolak resin.

The esterification ratio of the photosensitive agent compound is usually more than 80% and preferably more than 90%.

In the case of less than 1.2 of the A value in the formula (1) regarding the photoresist for the optical disc of the present embodiment, the resolution may be damaged. On the other hand, in the case of more than 2.0 of the A value, a crystal may be deposited and in such a case a product will be not used as photoresist. In the case of more than 0.3 of the B value in the formula (2), the resolution may be lowered because of increasing of the optical densities of the base resin and the decomposed material. That is, in a case where either one of the A value in the formula (1) and the B value in the formula (2) of the photoresist does not satisfy the aforementioned ranges, the CN ratio of the optical disc original manufactured by such photoresist cannot be improved, and accordingly, it is impossible to produce the optical disc with high density and having less noise in the reproduction time.

BRIEF DESCRIPTION OF THE DRAWING

A single drawing of FIG. 1 includes FIGS. 1(A) to 1(G) showing general steps in order for manufacturing an optical disc original.

DESCRIPTION OF THE PREFERRED EMBODIMENTS

First, for a better understanding of this invention, general manufacturing steps of the optical disc will be described hereunder with reference to FIG. 1.

Figure 1A:
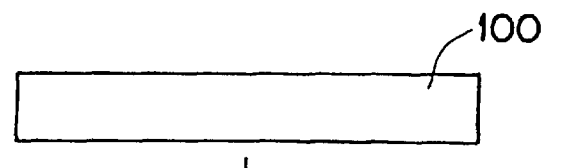
Figure 1B:
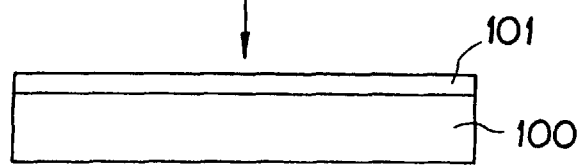
Figure 1C:
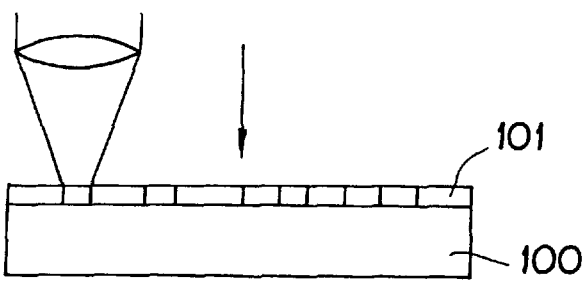
Figure 1D:
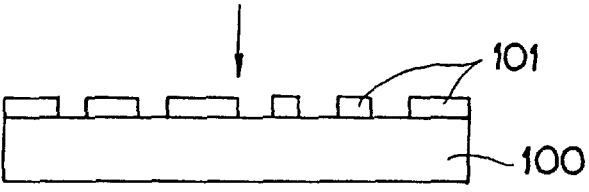
Figure 1E:
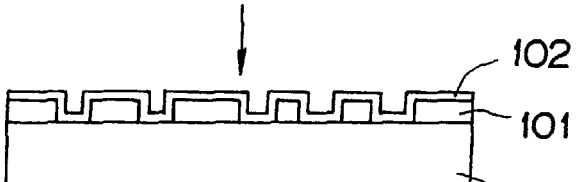
Figure 1F:
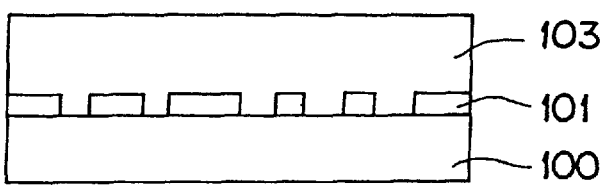
Figure 1G:
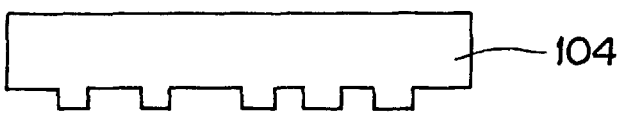

In a first step shown in FIG. 1A, a positive-type photoresist is coated with uniform thickness on a glass substrate 100 which was ground finely to thereby form a photoresist layer 101 as shown in FIG. 1B. In the next step of FIG. 1C, a laser beam is irradiated to a portion of the photoresist layer 101 at which a pit is formed. A portion of the photoresist layer 101 irradiated to the laser beam is easily dissolved in an alkali liquid developer in comparison with another portion not irradiated. Accordingly, when the development is performed by coating the alkali liquid developer on the photoresist layer 101, a recess corresponding to a pit is formed to the portion irradiated to the laser beam as shown in FIG. 1D. Thereafter, as shown in FIG. 1E, a metallic film 102 is formed on the photoresist layer 101 to which an electroconductivity is imparted, and in this step, for example, silver (Ag) or nickel (Ni) may be utilized as a metal for forming the metallic film. In the next step, as shown in FIG. 1F, an electrocasting treatment is performed to form an electrocast product, Ni electrocast 103, for example, on the metallic film 102. The nickel electrocast 103 is then peeled off from the glass substrate and the photoresist layer 101 together with the metallic film 102, the thus peeled off nickel electrocast and metallic film being called a metallic original, i.e. stamper 104 shown in FIG. 1G.

A preferred embodiment of the photoresist for the optical disc according to this invention will be next described hereunder with reference to experimental examples. The optical disc in the experiments was prepared generally in accordance with the method comprising the steps of coating a positive-type photoresist on a glass substrate to form a resist film, forming a pit pattern through a light exposure to the resist film, developing the resist film after the light exposure to form a resist original, effecting a plating treatment to the resist original to form a stamper through an electrocasting treatment, forming a replica disc through an injection molding process by utilizing the stamper, forming a reflection film on the replica disc, and forming an overcoat layer on the reflection film.

EXPERIMENTAL EXAMPLE 1

A material 1 was prepared by adding a photoresist of 20 weight % to a base of a commercial product of a semiconductor manufacturing photoresist (Manufactured by NIHON ZENON as "ZIR9000") containing photoresist (naphthoquinonediazido) of 30 to 40 weight parts with respect to a base resin (alkali fusible novolak resin) of 100 weight parts. The A and B values, referred to hereinbefore with reference to the formulas (1) and (2), were measured with wavelength of $\lambda$=351 nm with respect to the thus prepared material 1 and the commercial product "ZIP9000". The measured result is shown in following table 1.

TABLE 1

| | A value ($\mu m^{-1}$) | B value ($\mu m^{-1}$) | CN ratio (dB) |
|---|---|---|---|
| Material 1 | 1.35 | 0.21 | 60.8 |
| Material 2 | 1.60 | 0.24 | 61.4 |
| Material 3 | 1.99 | 0.29 | 61.0 |
| Commercial Product A | 1.10 | 0.20 | 58.8 |
| Commercial Product B | 1.48 | 0.42 | 57.1 |
| Commercial Product C | 0.56 | 0.23 | 54.5 |
| Commercial Product D | 0.88 | 0.24 | 56.4 |
| Commercial Product E | 0.74 | 0.22 | 55.0 |
| Commercial Product F | 1.32 | 0.47 | 55.4 |
| Commercial Product G | 1.52 | 0.46 | 56.8 |

In the above Table 1, the A and B values are one in the case of wave length λ=351 nm.

In the next step, a pit pattern was formed on a glass original by utilizing the photoresist.

In the measurement of the CN ratios of the thus prepared test originals, the material 1 provided the CN ratio higher by 2.0 dB than that of the commercial product A. The result of the comparison of the CN ratios are also shown in the Table 1. In the experiments, the constructions of the recording system and the reproduction system and the record reproduction conditions of signals were as follows.

Construction of Recording System:
λ=351 nm; Numerical Aperture NA=0.9
Construction of Reproduction System:
λ=442 nm; Numerical Aperture NA=0.5
Signal Recording:
f=10 MHz; Linear Speed=6 m/sec (CLV)
Signal Reproduction:
Linear Speed=6 m/sec; RBW=30 KHz

EXPERIMENTAL EXAMPLE 2

The material 2 was prepared by adding the photosensitive agent by the amount of 50% to the base material of the commercial product A, and the A and B values of the thus prepared material 2 were measured under substantially the same conditions as those in the Example 1. The measured result is also shown in the Table 1.

A pit pattern was formed on a glass original by using the material 2. This original provided the CN ratio higher by the amount of 2.6 dB than that of the commercial product A. This comparison result is also shown in the Table 1.

EXPERIMENTAL EXAMPLE 3

The material 3 was prepared by adding the photosensitive agent by the amount of 100% to the base material of the commercial product A, and the A and B values of the thus prepared material 3 were measured under substantially the same conditions as those in the Example 1. The measured result is also shown in the Table 1.

A pit pattern was formed on a glass original by using the material 3. This original provided the CN ratio higher by the amount of 2.2 dB than that of the commerical product A. This comparison result is also shown in the Table 1.

COMPARATIVE EXPERIMENTAL EXAMPLES

The A and B values were measured with respect to six kinds of commercial products B, C, D, E, F and G of photoresist for manufacturing semiconductors, and pit patterns were formed on glass originals by utilizing these photoresists. The measured CN ratios of these originals are shown in the Table 1.

CONSIDERATION OF RESULT

As is apparent from the Table 1, the CN ratios of the original disc originals prepared by utilizing the materials 1, 2 and 3 were remarkably improved in comparison with CN ratios of the optical disc originals prepared by utilizing the respective kinds of commercial products of semiconductor manufacturing photoresists, from which it was confirmed that the photoresists for the optical discs according to this invention could be suitable for the manufacturing of the optical discs with high recording density.

What is claimed is:

1. A method of preparing an optical disc comprising the steps of:

preparing a positive-type photoresist consisting essentially of a base resin and a photosensitive material and also preparing a glass substrate;

coating the photoresist on the glass substrate to form a resist film;

forming a pit pattern through a light exposure at a wavelength of 351 nm to the resist film;

developing the resist film after the light exposure to form a resist original;

effecting a plating treatment to the resist original to form a stamper;

forming a replica disc through an injection molding process by utilizing the stamper;

forming a reflection film on the replica disc; and forming an overcoat layer on the reflection film, wherein the positive-type photoresist satisfies a condition that a value of A in a formula $A=(a_1-a_3)m_{10}$, wherein $a_1$ represents a molar absorption coefficient of the photosensitive material with respect to a light utilized for an actual recording, $a_3$ represents a molar absorption coefficient of a decomposed product derived from the photosensitive material with respect to light utilized for actual recording and $m_{10}$ represents an original density of the photosensitive material, is in a range of $1.2 \leq A$ value $\leq 2.0$, and that a value of B in a formula $B=(a_2m_{20}+a_3m_{10})$, wherein $a_2$ represents a molar absorption coefficient of the base resin with respect to light utilized for actual recording, $a_3$ represents a molar absorption coefficient of a decomposed product derived from the photosensitive material with respect to a light utilized for actual recording, $m_{10}$ represents an original density of the photosensitive material and $m_{20}$ represents a density of the base resin, being constant, is in a range of B value $\leq 0.3$.

2. A method according to claim 1, wherein the stamper is formed by an electrocasting method.

3. A method according to claim 1, wherein the base resin is composed of an alkal fusible novolak resin having a molecular weight distribution less than 5.8.

4. A method according to claim 3, wherein the photosensitive material is composed of a naphtoquinonediazido.

5. A method according to claim 4, wherein the naphtoquinonediazido has weight more than 30 weight parts with respect to 100 weight parts of the alkali fusible novolak resin.

* * * * *